US009478648B2

(12) United States Patent
Ikura

(10) Patent No.: US 9,478,648 B2
(45) Date of Patent: Oct. 25, 2016

(54) SEMICONDUCTOR DEVICE

(71) Applicant: Fuji Electric Co., Ltd., Kanagawa (JP)

(72) Inventor: Yoshihiro Ikura, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/959,877

(22) Filed: Dec. 4, 2015

(65) Prior Publication Data

US 2016/0211354 A1 Jul. 21, 2016

(30) Foreign Application Priority Data

Jan. 19, 2015 (JP) .................................. 2015-007441

(51) Int. Cl.
*H01L 29/739* (2006.01)
*H01L 29/06* (2006.01)
*H01L 29/10* (2006.01)
*H01L 29/08* (2006.01)
*H01L 27/082* (2006.01)

(52) U.S. Cl.
CPC ....... *H01L 29/7397* (2013.01); *H01L 27/0823* (2013.01); *H01L 29/0696* (2013.01); *H01L 29/0804* (2013.01); *H01L 29/0821* (2013.01); *H01L 29/1095* (2013.01)

(58) Field of Classification Search
CPC .................................................. H01L 29/7397
See application file for complete search history.

(56) References Cited

U.S. PATENT DOCUMENTS

| 5,448,083 A * | 9/1995 | Kitagawa ............ H01L 29/7455 257/133 |
| 6,815,769 B2 | 11/2004 | Pfirsch et al. |
| 2001/0054738 A1 | 12/2001 | Momota et al. |

(Continued)

FOREIGN PATENT DOCUMENTS

| JP | H5-243561 A | 9/1993 |
| JP | 2001-308327 A | 11/2001 |
| WO | 2009/122486 A1 | 10/2009 |

OTHER PUBLICATIONS

Yamaguchi et al., "IEGT Design Criterion for Reducing EMI Noise", Proceedings of 2004 International Symposium on Power Semiconductor Devices & ICs, Kitakyushu, pp. 115-118.

(Continued)

*Primary Examiner* — Matthew Landau
*Assistant Examiner* — Grant Withers
(74) *Attorney, Agent, or Firm* — Chen Yoshimura LLP

(57) ABSTRACT

A shield electrode is formed above a floating p region in a semiconductor layer and connected to a gate electrode in a trench. The shield electrode is composed of a material having an electrical resistivity lower than that of the gate electrode.

16 Claims, 4 Drawing Sheets

(56) References Cited

U.S. PATENT DOCUMENTS

| | | | | |
|---|---|---|---|---|
| 2005/0167742 A1* | 8/2005 | Challa | ................ | H01L 21/3065 257/328 |
| 2009/0291520 A1* | 11/2009 | Yoshikawa | ......... | H01L 27/0248 438/55 |
| 2010/0163846 A1* | 7/2010 | Yilmaz | ............... | H01L 29/7827 257/24 |
| 2010/0289076 A1* | 11/2010 | Nishida | ............... | H01L 29/0696 257/334 |
| 2010/0327313 A1* | 12/2010 | Nakamura | .......... | H01L 29/0834 257/133 |
| 2011/0169103 A1* | 7/2011 | Darwish | .............. | H03K 17/687 257/409 |
| 2012/0273897 A1* | 11/2012 | Shiraishi | ............. | H01L 27/0664 257/379 |
| 2013/0075810 A1* | 3/2013 | Hsieh | ................ | H01L 29/66348 257/328 |
| 2013/0168731 A1* | 7/2013 | Hsieh | .................... | H01L 29/407 257/140 |
| 2014/0097431 A1* | 4/2014 | Zundel | .................... | H01L 22/14 257/48 |
| 2014/0124855 A1* | 5/2014 | Hebert | ................ | H01L 29/7813 257/334 |
| 2014/0264477 A1* | 9/2014 | Bhalla | ............... | H01L 29/41766 257/263 |
| 2015/0380403 A1* | 12/2015 | Kotsar | .................. | H01L 27/088 257/334 |
| 2016/0064546 A1* | 3/2016 | Zitouni | ............... | H01L 29/7811 257/334 |
| 2016/0079376 A1* | 3/2016 | Hirler | .................. | H01L 29/407 257/328 |

OTHER PUBLICATIONS

Onozawa et al., "Development of the next generation 1200V trench-gate FS-IGBT featuring lower EMI noise and lower switching loss", Proceedings of the 19th International Symposium on Power Semiconductor Devices & ICs, May 27-30, 2007, pp. 13-16, Jeju, Korea.

* cited by examiner

SEMICONDUCTOR DEVICE

BACKGROUND OF THE INVENTION

1. Technical Field

The present invention relates to a semiconductor device having a trench gate IGBT structure.

2. Background Art

As power converters continue to consume less power, there are increasing expectations for power devices, which play a central role in the power converters, to also consume less power. Among these power devices, voltage-driven insulated gate bipolar transistors (IGBTs) are being used. These IGBTs are capable of realizing low ON-voltages due to conductivity modulation and of easily controlling current by applying voltage to an insulated gate. Planar gate IGBTs, trench gate IGBTs, and the like are known as types of IGBTs, for example.

The planar gate IGBTs have a metal oxide semiconductor (MOS) gate structure in which an oxide film and a gate electrode are provided on a flat part of the front surface-side of a silicon substrate. The trench gate IGBTs have a MOS gate structure in which an oxide film and gate electrodes (hereafter referred to as trench gates) embedded in polysilicon are provided within trenches formed on the front surface-side of a silicon substrate. The trench gate IGBTs have channels formed along both lateral walls of the trenches, thus allowing greater channel density per unit area and lower ON-voltage than those of the planar gate IGBTs, which have channels formed along the front surface of the substrate. Thus, recently, the fields in which trench gate IGBTs can be applied have been increasing.

Here, the main points of conventional trench gate IGBT technology are described using a trench gate IGBT according to Patent Document 1 below as an example.

FIG. 4 schematically shows a cross section cut in the direction (a lateral direction) that trenches of the trench gate IGBT, which is provided with floating p regions, are arranged. As shown in the same figure, a p$^-$ layer 4 is provided on one surface layer of a silicon substrate that is provided with an n drift layer 1. An n$^+$ buffer layer 3 is provided on the other surface layer of the silicon substrate. A p$^+$ collector layer 2 is provided under the n$^+$ buffer layer 3. Hereafter, the side that is provided with the p$^-$ layer 4 is defined as the front surface of the silicon substrate, and the side that is provided with the p$^+$ collector layer 2 is defined as the back surface of the silicon substrate. The trench gate IGBT is provided with a plurality of trenches 6 that penetrate from the front surface-side of the silicon substrate, through the p$^-$ layer 4, reaching the n drift layer 1 in the depth direction. The p$^-$ layer 4 is segmented into first p base regions 12 and floating p regions 13 by the trenches 6. The first p base regions 12 and the floating p regions 13 are repeatedly disposed in an alternating fashion in the lateral direction that the trenches 6 are arranged, for example, and extend as straight lines that are parallel to the trenches 6 in a longitudinal direction orthogonal to the lateral direction. Selectively provided inside of the first p base regions 12 are n$^+$ emitter regions 5. Furthermore, selectively provided inside of the first p base regions 12 and adjacent to the n$^+$ emitter regions 5 are second p base regions 11. Portions of the first p base regions 12 along the lateral walls of the trenches 6 have n-type inversion layers formed thereon. The n-type inversion layers become paths for the main current during the ON state.

An emitter electrode 10 is conductively connected to the second p base regions 11 and the n$^+$ emitter regions 5 via contact holes provided in an interlayer insulating film 9. A collector electrode 14 is conductively connected to the p$^+$ collector layer 2 at the back surface-side of the silicon substrate. Gate electrodes 8 are provided inside the trenches 6 with gate insulating films 7 interposed therebetween.

Next is a description of the operation of the trench gate IGBT during turn-ON, which is when the trench gate IGBT transitions from the OFF state to the ON state. Normally, the emitter electrode 10 is connected to ground or has a negative voltage applied thereto. The collector electrode 14 has a positive voltage applied thereto. In this manner, when a voltage applied to the gate electrodes 8 is lower than the threshold value, even when a voltage that is higher than the voltage at the emitter electrode 10 is applied to the collector electrode 14, current does not flow between the emitter electrode 10 and the collector electrode 14, because the p-n junction between the first p base region 12 and the n drift layer 1 is reverse biased. That is, the IGBT maintains the OFF state. When a voltage that exceeds the threshold value is applied to the gate electrode 8, electric charge begins to accumulate in the gate electrode 8, and at the same time, channel regions that have inverted into n-type regions are formed on the surface layers of the first p base regions 12 in contact with the gate insulating films 7 and are facing the gate electrodes 8. Thus, electrons emitted from the emitter electrode 10 travel through n-type regions composed of the n$^+$ emitter regions 5 and the channel regions and are injected into the n drift layer 1. The injection of the electrons into the n$^-$ drift layer 1 causes the p-n junction between the p$^+$ collector region 2 and the n drift layer 1 to become forward biased and injects positive holes into the n$^-$ drift layer 1 from the collector electrode 14, thus causing a current to flow between the emitter electrode 10 and the collector electrode 14 and the IGBT to enter the ON state. The ON-voltage is the voltage drop between the emitter electrode 10 and the collector electrode 14 in the ON state.

In this IGBT, the positive holes injected into the n drift layer 1 from the collector side do not easily travel to the emitter electrode 10 when the IGBT is in the ON state, because of the floating p regions 13, which are electrically insulated from the emitter electrode 10 by the interlayer insulating films 9. Thus, the positive holes accumulate in the floating p regions 13, and the carrier concentration distribution of the n drift layer 1 is increased to a level close to the carrier concentration distribution of a diode, causing the ON-voltage to lower.

However, in this trench gate IGBT, which is provided with the floating p regions 13, a displacement current corresponding to the gate-collector capacitance flows through the gate electrodes 8 into the floating p regions 13 during turn-ON, because the floating p regions 13 and the gate electrodes 8 face each other across the gate insulating films 7, which are provided on the lateral walls of the trenches interposed therebetween. This displacement current charges the input capacitance, and the gate voltage increases, thus creating a problem in which the rate of change in the collector current during turn-ON becomes large and the controllability of the switching speed deteriorates.

In the trench gate IGBTs according to Patent Documents 2 and 3 below, the above problem is dealt with by providing shield electrodes on surfaces in contact with the floating p regions 13 and/or lateral surfaces in contact with the trenches 6.

RELATED ART DOCUMENTS

Patent Documents

Patent Document 1: Japanese Patent Application Laid-Open Publication No. 2001-308327
Patent Document 2: Japanese Patent Application Laid-Open Publication No. H5-243561
Patent Document 3: U.S. Pat. No. 6,815,769

SUMMARY OF THE INVENTION

However, when the shield electrodes are disposed above the floating p regions 13 in the trench gate IGBT, the shield electrodes cause the surface of the substrate to become uneven, thus creating a decline in reliability due to a drop in the processing accuracy for photolithography, a deterioration of the dielectric breakdown voltage due to a failure to cover an uneven interlayer insulating film and metallic wiring, electromigration-induced disconnection, and the like.

Accordingly, the present invention is directed to a scheme that substantially obviates one or more of the above-discussed and other problems due to limitations and disadvantages of the related art. An objective of the present invention is to provide a semiconductor device that has an element structure in which surface unevenness is minimal in a trench gate IGBT, and that is capable of controlling the rate of change in the collector current during turn-ON with excellent accuracy.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a first semiconductor layer of a first conductivity type; a second semiconductor layer of a second conductivity type provided on one surface of the first semiconductor layer; a third semiconductor layer of the first conductivity type selectively provided in the second semiconductor layer; a fourth semiconductor layer of the second conductivity type selectively provided in the second semiconductor layer so as to be adjacent and connected to the third semiconductor layer; trenches each penetrating the second semiconductor layer to reach the first semiconductor layer, dividing the second semiconductor layer into a base region and a floating region, the base region having the third and fourth semiconductor layers therein, one sidewall of each of the trenches abutting the third semiconductor layer; a fifth semiconductor layer of the second conductivity type provided below and electrically connected to another surface of the first semiconductor layer; an emitter electrode electrically connected to the third semiconductor layer and the fourth semiconductor layer and electrically insulated from the floating region of the second semiconductor layer; a collector electrode electrically connected to the fifth semiconductor layer; a gate electrode provided in each of the trenches; a gate insulating film provided in each of the trenches between the corresponding gate electrode and the trench; a shield electrode provided over the floating region of the second semiconductor layer, the shield electrode being made of a material having an electrical resistivity lower than that of the gate electrode and being electrically connected to the gate electrode; and an insulating film provided between the shield electrode and the floating region of the second semiconductor layer.

The present invention, in at least one aspect, is capable of making the shield electrodes in the trench gate IGBT into thin films and, as a result, reducing the unevenness of the device surface, because the shield electrodes are composed of a material that has an electrical resistivity lower than those of the gate electrodes. Furthermore, in at least one aspect, the present invention is capable of increasing the processing accuracy for photolithography, favorably covering the unevenness of interlayer insulating films and metallic wiring, and improving the dielectric breakdown voltage and the electromigration resistance. By providing the shield electrodes, it is also possible to suppress the displacement current flowing into the gate electrodes during turn-ON and to control the rate of change in the collector current during turn-ON with excellent accuracy.

In the semiconductor device of one aspect of the present invention, it is preferable that the shield electrode be made of a conductive film including a single film or a multilayer film including one or more of a metal silicide, a metal having a high melting point, and a metallic nitride having a high melting point.

Using the aforementioned aspect of the present invention, it is possible to make the shield electrodes into thin films without increasing the sheet resistance because it is possible to form the shield electrodes using a material that has an electrical resistivity lower than that of polysilicon.

In the semiconductor device of one aspect of the present invention, it is preferable that a film thickness of the shield electrode be 10 nm to 800 nm.

Using the aforementioned aspect of the present invention, it is possible to reduce the unevenness of the surface and to favorably improve the ability to cover the unevenness of the interlayer insulating films and the emitter electrode by making the shield electrodes into thin films.

In the semiconductor device of one aspect of the present invention, it is preferable that the shield electrode laterally extend above the trench to directly connect to the gate electrode.

Using the aforementioned aspect of the present invention, it becomes easy to control the displacement current flowing into the gate electrodes during turn-ON, because the shield electrodes are directly connected to the gate electrodes and because the shield electrodes and the gate electrodes operate with substantially similar electric potentials.

In the semiconductor device of one aspect of the present invention, it is preferable that the insulating film disposed between the shield electrode and the floating region have a thickness greater than that of the gate insulating film.

Using the aforementioned aspect of the present invention, it is possible to reduce the gate-collector capacitance associated with the shield electrodes and to increase the switching speed.

The present invention, in at least one aspect, is capable of making the shield electrodes in the trench gate IGBT into thin films and, as a result, reducing the unevenness of the device surface, because the shield electrodes are composed of a material that has an electrical resistivity lower than those of the gate electrodes. Furthermore, in at least one aspect, the present invention is capable of increasing the processing accuracy for photolithography, favorably covering the unevenness of the interlayer insulating films and the metallic wiring, and improving the dielectric breakdown voltage and the electromigration resistance. By providing the shield electrodes, it is also possible to suppress the displacement current flowing into the gate electrodes during turn-ON and to control the rate of change in the collector current during turn-ON with excellent accuracy.

It is to be understood that both the foregoing general description and the following detailed description are exemplary and explanatory, and are intended to provide further explanation of the invention as claimed.

DETAILED DESCRIPTION OF EMBODIMENTS

Figure 1:
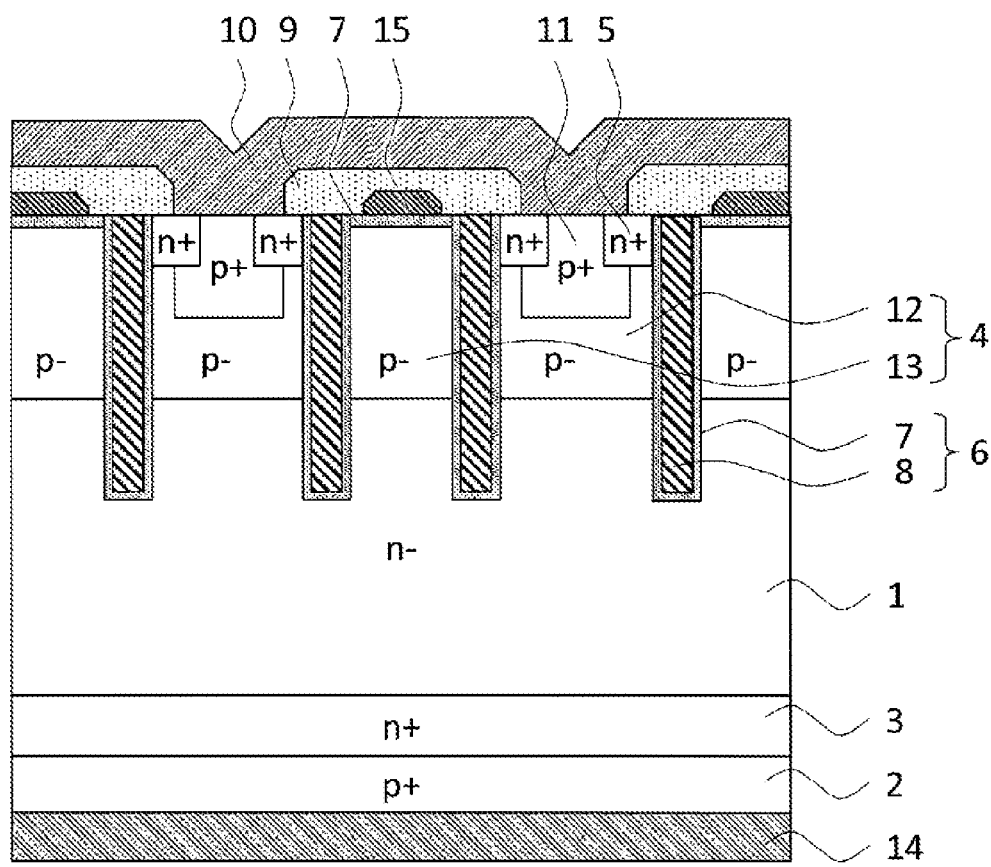
FIG. 1 is a cross-sectional schematic view of one embodiment of the semiconductor device of the present invention.

Suitable embodiments of the semiconductor device of the present invention are described in detail below with reference to the attached figures. In the present specification and the attached figures, electrons and positive holes signify majority carriers in layers and regions to which n or p is assigned. In addition, + and − attached to n and p signify a higher impurity concentration and a lower impurity concentration, respectively, compared to layers and regions that are not assigned a + or −. Note that in the description of the embodiments and the attached figures below, similar configurations are given the same reference characters and redundant descriptions are omitted.

Embodiment 1

An n channel IGBT is described in detail below as one example of a semiconductor device according to Embodiment 1. This n channel IGBT has striped trench gates disposed therein extending in a longitudinal direction orthogonal to the lateral direction that the trenches are arranged.

FIG. 1 is a cross-sectional schematic view cut in the direction (the lateral direction) that the trench gates of the semiconductor device according to Embodiment 1 of the present invention are arranged. The semiconductor device according to Embodiment 1 is provided with an active region, which is shown in FIG. 1, in which current flows when the semiconductor device is in the ON state and a termination structure, which is not shown in the figures, for maintaining the breakdown voltage by reducing the electric field at the front surface-side of the semiconductor device.

In the active region, a p⁻ layer 4 is provided on one surface layer of a silicon substrate that is provided with an n⁻ drift layer 1 (the first semiconductor layer). An n⁺ buffer layer 3 is provided on the other surface layer of the silicon substrate. A p⁺ collector layer 2 (the sixth semiconductor layer) is provided under the n⁺ buffer layer 3. Hereafter, the side on which the p⁻ layer 4 is provided is defined as the front surface of the silicon substrate, and side on which the p⁺ collector layer 2 is provided is defined as the back surface of the silicon substrate. The trench gate IGBT is provided with a plurality of trenches 6 that penetrate from the front surface-side of the silicon substrate, through the p⁻ layer 4, reaching the n⁻ drift layer 1 in the depth direction. The p⁻ layer 4 is segmented into first p base regions 12 (the second semiconductor layer) and floating p regions 13 (the fifth semiconductor layer) by the trenches 6. The first p base regions 12 and the floating p regions 13 are repeatedly disposed in an alternating fashion in the lateral direction that the trenches 6 are arranged, for example, and extend as straight lines that are parallel to the trenches 6 in a longitudinal direction orthogonal to the lateral direction. Selectively provided inside of the first p base regions 12 are n⁺ emitter regions 5 (the third semiconductor layer). Furthermore, selectively provided inside of the first p base regions 12 and adjacent to the n⁺ emitter regions 5 are second p base regions 11 (the fourth semiconductor layer). Portions of the first p base regions 12 along the lateral walls of the trenches 6 have n-type inversion layers formed thereon. The n-type inversion layers become paths for the main current during the ON state.

An emitter electrode 10 is conductively connected to the second p base regions 11 and the n⁺ emitter regions 5 via contact holes provided in the interlayer insulating films 9. A collector electrode 14 is conductively connected to the p⁺ collector layer 2 at the back surface-side of the silicon substrate. Gate electrodes 8 are provided inside the trenches 6 with gate insulating films 7 interposed therebetween. A shield electrode 15 is provided above each of the floating p regions 13 with the gate insulating films 7 interposed therebetween.

The floating p regions 13 are electrically insulated from the emitter electrode 10 by the interlayer insulating films 9, which cover the surface of the p⁻ layer 4. In addition, the floating p regions 13 are electrically insulated from the n⁻ drift layer 1 by the p-n junction, which has the n⁻ drift layer 1 on one side. The floating p regions 13 are also insulated from the gate electrodes 8 by the gate insulating films 7. The shield electrodes 15 are electrically insulated from the floating p regions 13 by the gate insulating films 7. The shield electrodes 15 are also electrically insulated from the emitter electrode 10 by the interlayer insulating films 9. In addition, the shield electrodes 15 are electrically connected to the gate electrodes 8 through the external peripheral part of an element (not shown). The shield electrodes 15 maintain the same electric potentials as those of the gate electrodes 8.

The termination structure is provided so as to enclose the active region, and furthermore, a breakdown-withstanding structure (not shown) composed of guard rings, field plates, and the like, for example, is provided on the front surface-side of the silicon substrate. A passivation protective film (not shown) composed of a silicon nitride film or an amorphous silicon film, for example, is provided on the surface of the emitter electrode 10.

For at least one aspect of the semiconductor device of the present invention, the shield electrodes 15 are formed using a material having an electrical resistivity lower than those of the gate electrodes 8. With this type of configuration, it is possible to make shield electrodes that are thinner than conventional shield electrodes without increasing the sheet resistance of the shield electrodes. By making the shield electrodes thin, the surface unevenness is reduced, the coverage of the unevenness of the interlayer insulating film and the metallic wiring becomes excellent, and the dielectric breakdown voltage and the electromigration resistance are improved. In addition, by reducing the surface unevenness, the resolution for photolithography processing is improved.

As a material for the shield electrodes 15, a material having low electrical resistivity and high heat resistance is preferable, and it is possible to suitably use: a multilayer film in which a metal having a high melting point and a metallic nitride having a high melting point are layered; a multilayer film in which a metallic silicide and a polysilicon are layered; a single film composed of one or more alloys selected from a metallic silicide such as titanium silicide, cobalt silicide, tungsten silicide, molybdenum silicide, nickel silicide, and platinum silicide, a metal having a high melting point such as tungsten, tantalum, and molybdenum, a metallic nitride having a high melting point such as titanium nitride, tantalum nitride, and tungsten nitride; or the like, for example. The method for forming the shield electrodes 15 is not particularly limited, and sputtering or chemical vapor deposition can be used, for example.

It is preferable that the sheet resistance of the shield electrodes 15 be 12 $\Omega$/sq or less, and 8 $\Omega$/sq or less is more preferable. When the shield electrodes 15 are composed of polysilicon, it is necessary to make the film thickness of the polysilicon 800 nm or greater in order to meet the above sheet resistance requirements, but a film thickness of 800 nm or greater causes large unevenness in the device surface.

In at least one aspect of the present invention, a material having an electrical resistivity lower than that of polysilicon is used, and it is preferable that the film thickness of the shield electrodes 15 be 10-800 nm. It is more preferable for the film thickness be 30-200 nm, and 50-150 nm is particularly preferable. When the film thickness of the shield electrodes 15 is less than 10 nm, the sheet resistance significantly increases. When the film thickness is greater than 800 nm, the coverage of the interlayer insulating films significantly worsens and therefore is not preferable.

Next, the operation of the semiconductor device according to Embodiment 1 of the present invention is described. In the semiconductor device according to Embodiment 1, it is possible to significantly improve the controllability of the rate of change in the collector current during turn-ON because the shield electrodes 15 are provided above the floating p regions 13. The reasons therefor are as follows.

During turn-ON, first the electric potentials of the gate electrodes 8 begin to increase. In addition, the floating p regions 13 are electrically charged and the electric potentials of the floating p regions 13 also increase due to the displacement current caused by the rise in the electric potentials of the gate electrodes 8 and the shield electrodes 15. When the electric potentials of the gate electrodes 8 exceed the threshold value, inversion layers are formed on the first p base regions 12 facing the gate electrodes 8 with the gate insulating films 7 interposed therebetween to form channels. Thus, electrons pass through the channels and are injected from the emitter regions 5, and accordingly, positive holes are injected from the p$^+$ collector region 2. The positive holes that were injected from the p$^+$ collector region 2 accumulate in the floating p regions 13, thus increasing the electric potentials of the floating p regions 13. However, before the positive holes begin accumulating, the electric potentials of the floating p regions 13 have increased to an extent because the shield electrodes 15 are provided above the floating p regions 13. Afterwards, the positive holes accumulate and the electric potentials of the floating p regions 13 further increase, but the increases in the electric potentials are after the electric potentials have already risen to an extent, thus making the rate of change in the electric potentials small. Therefore, the inflow of the displacement current to the gate electrodes 8, which is due to the increases in the electric potentials of the floating p regions 13, is suppressed compared to when the shield electrodes 15 are not provided. Thus, the electric potentials of the gate electrodes 8 are less susceptible to the effects of the displacement current, making it is possible to improve the controllability of the rate of change in the current for the collector current during turn-ON.

Embodiment 2

An n channel IGBT is described in detail below as one example of a semiconductor device according to Embodiment 2. This n channel IGBT has striped trench gates disposed therein extending in a longitudinal direction orthogonal to the lateral direction that the trenches are arranged.

Figure 2:
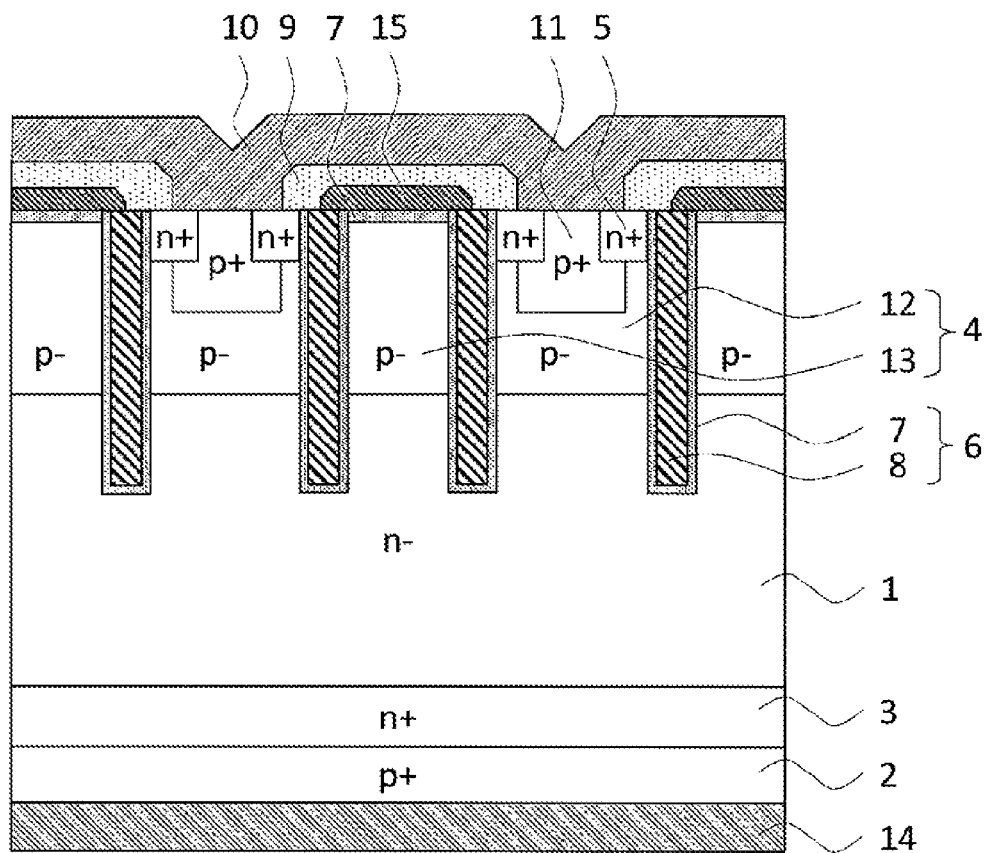
FIG. 2 is a cross-sectional schematic view of another embodiment of the semiconductor device of the present invention.

FIG. 2 is a cross-sectional schematic view cut in the lateral direction that the trench gates of the semiconductor device according to Embodiment 2 of the present invention are arranged. FIG. 2 is different from FIG. 1 in that the shield electrodes 15 are electrically connected to the gate electrodes 8 on the upper portion of the trenches 6 and maintain the same electric potentials as those of the gate electrodes 8. With this configuration, it is possible to further improve the controllability of the rate of change in the collector current during turn-ON, because the connection distance between the shield electrodes 15 and the gate electrodes 8 is shortened and there is almost no voltage drop due to the wiring resistance up to the point of connection.

Embodiment 3

An n channel IGBT is described in detail below as one example of a semiconductor device according to Embodiment 3. This n channel IGBT has striped trench gates disposed thereon extending in a longitudinal direction orthogonal to the lateral direction that the trenches are arranged.

Figure 3:
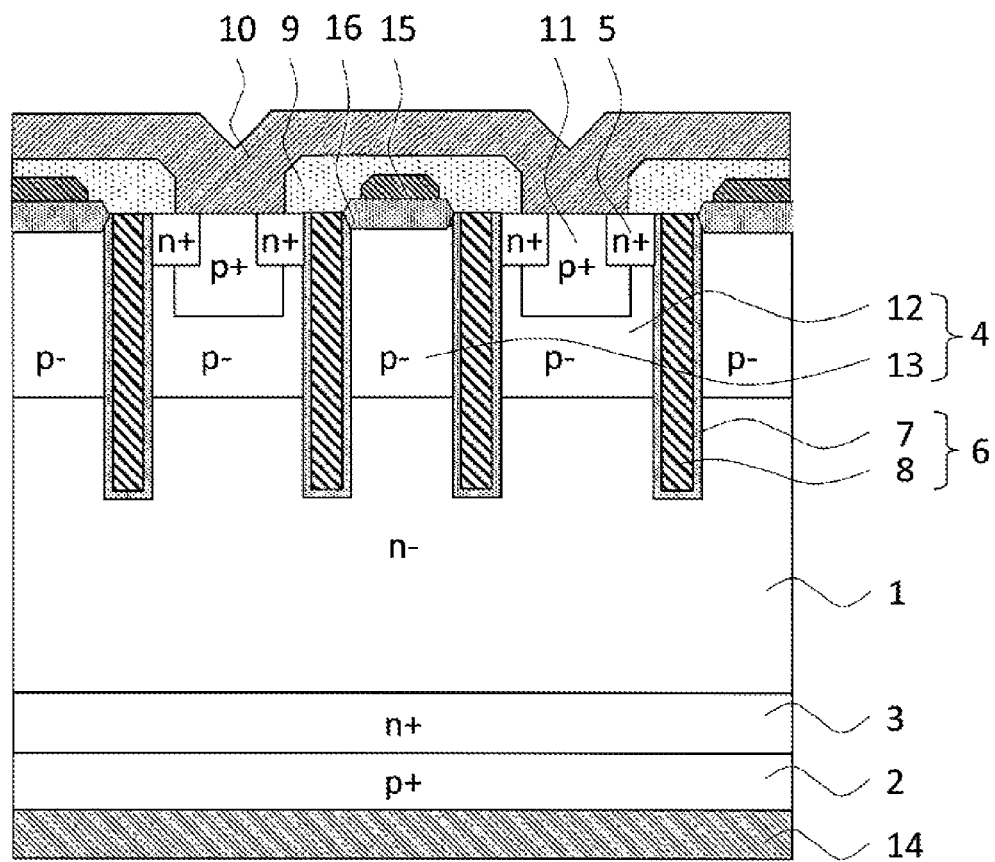
FIG. 3 is a cross-sectional schematic view of yet another embodiment of the semiconductor device of the present invention.
Figure 4:
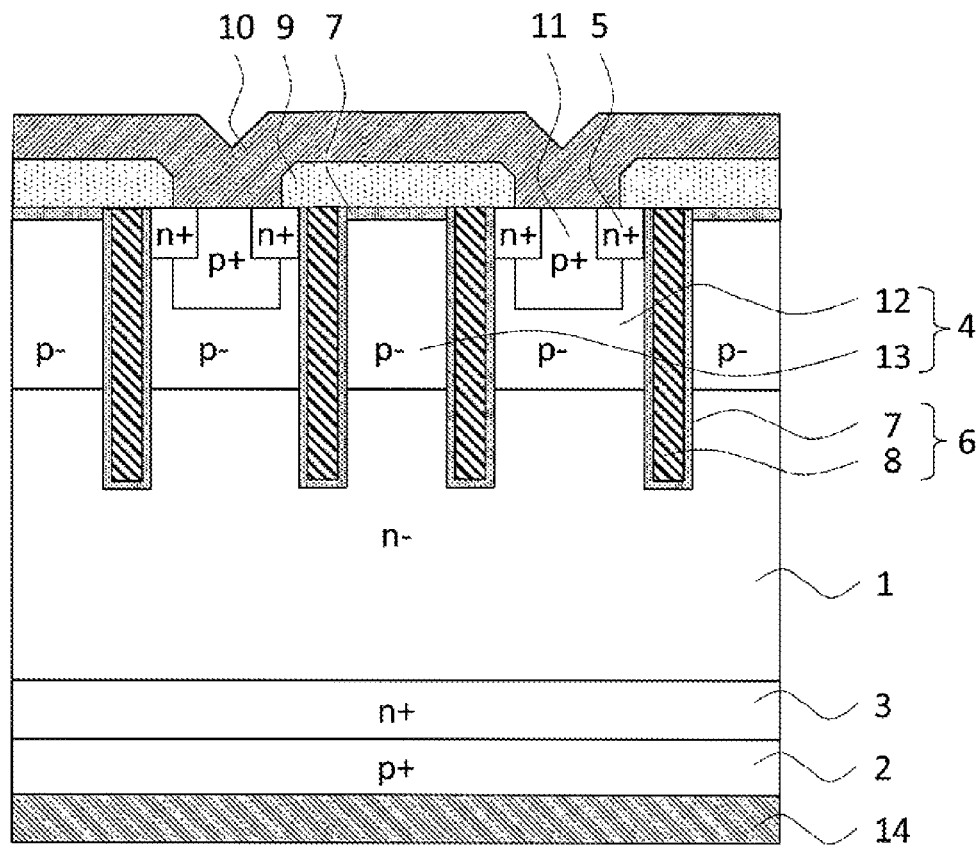
FIG. 4 is a cross-sectional schematic view showing one example of a conventional semiconductor device.

FIG. 3 is a cross-sectional schematic view cut in the lateral direction that the trench gates of the semiconductor device according to Embodiment 3 of the present invention are arranged. FIG. 3 is different from FIG. 1 in that the shield electrodes 15 are electrically insulated from the floating p regions 13 by thick insulating films 16 that are thicker than the gate insulating films 7. With this configuration, it is possible to reduce the gate-collector capacitance associated with the shield electrodes and to increase the switching speed because the film thickness of the thick insulating films 16 is large.

It is preferable that the thickness of the thick insulating films 16 be 100-800 nm, for example. When the film thickness is greater than 800 nm, the thick insulating films 16 themselves cause surface unevenness and therefore it is not preferable that the thickness be greater than 800 nm.

As shown above, the present invention is not limited to the embodiments described above and can be applied to insulated gate semiconductor devices of a variety of configurations. In addition, in each of the embodiments, the first conductivity type is the n-type, and the second conductivity type is the p-type, but the present invention is similarly possible even when the first conductivity type is the p-type, and the second conductivity type is the n-type.

INDUSTRIAL APPLICABILITY

The semiconductor device according to at least one aspect of the present invention is useful as a power semiconductor device used in power conversion apparatuses and the like.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a first semiconductor layer of a first conductivity type;
   a second semiconductor layer of a second conductivity type provided on one surface of the first semiconductor layer;
   a third semiconductor layer of the first conductivity type selectively provided in the second semiconductor layer;
   a fourth semiconductor layer of the second conductivity type selectively provided in the second semiconductor layer so as to be adjacent and connected to the third semiconductor layer;
   trenches each penetrating the second semiconductor layer to reach the first semiconductor layer, dividing the second semiconductor layer into a base region and a floating region, the base region having the third and fourth semiconductor layers therein, one sidewall of each of the trenches abutting the third semiconductor layer;
   a fifth semiconductor layer of the second conductivity type provided below and electrically connected to another surface of the first semiconductor layer;
   an emitter electrode electrically connected to the third semiconductor layer and the fourth semiconductor layer and electrically insulated from the floating region of the second semiconductor layer;
   a collector electrode electrically connected to the fifth semiconductor layer;
   a gate electrode provided in each of the trenches;
   a gate insulating film provided in each of the trenches between the corresponding gate electrode and the trench;
   a shield electrode provided over the floating region of the second semiconductor layer, the shield electrode being made of a material having an electrical resistivity lower than that of the gate electrode and being electrically connected to the gate electrode; and
   an insulating film provided between the shield electrode and the floating region of the second semiconductor layer.

2. The semiconductor device according to claim 1, wherein the shield electrode is made of a conductive film including a single film or a multilayer film comprising one or more of a metal silicide, a metal having a high melting point, and a metallic nitride having a high melting point.

3. The semiconductor device according to claim 2, wherein a film thickness of the shield electrode is 10 nm to 800 nm.

4. The semiconductor device according to claim 3, wherein the shield electrode laterally extends above the trench to directly connect to the gate electrode.

5. The semiconductor device according to claim 4, wherein the insulating film disposed between the shield electrode and the floating region has a thickness greater than that of the gate insulating film.

6. The semiconductor device according to claim 3, wherein the insulating film disposed between the shield electrode and the floating region has a thickness greater than that of the gate insulating film.

7. The semiconductor device according to claim 2, wherein the shield electrode laterally extends above the trench to directly connect to the gate electrode.

8. The semiconductor device according to claim 7, wherein the insulating film disposed between the shield electrode and the floating region has a thickness greater than that of the gate insulating film.

9. The semiconductor device according to claim 2, wherein the insulating film disposed between the shield electrode and the floating region has a thickness greater than that of the gate insulating film.

10. The semiconductor device according to claim 1, wherein a film thickness of the shield electrode is 10 nm to 800 nm.

11. The semiconductor device according to claim 10, wherein the shield electrode laterally extends above the trench to directly connect to the gate electrode.

12. The semiconductor device according to claim 11, wherein the insulating film disposed between the shield electrode and the floating region has a thickness greater than that of the gate insulating film.

13. The semiconductor device according to claim 10, wherein the insulating film disposed between the shield electrode and the floating region has a thickness greater than that of the gate insulating film.

14. The semiconductor device according to claim 1, wherein the shield electrode laterally extends above the trench to directly connect to the gate electrode.

15. The semiconductor device according to claim 14, wherein the insulating film disposed between the shield electrode and the floating region has a thickness greater than that of the gate insulating film.

16. The semiconductor device according to claim 1, wherein the insulating film disposed between the shield electrode and the floating region has a thickness greater than that of the gate insulating film.

* * * * *

UNITED STATES PATENT AND TRADEMARK OFFICE
CERTIFICATE OF CORRECTION

| | |
|---|---|
| PATENT NO. | : 9,478,648 B2 |
| APPLICATION NO. | : 14/959877 |
| DATED | : October 25, 2016 |
| INVENTOR(S) | : Yoshihiro Ikura |

Page 1 of 1

It is certified that error appears in the above-identified patent and that said Letters Patent is hereby corrected as shown below:

IN THE SPECIFICATION

Column 1, line 41, the text "n drift layer 1" should be changed to -- n⁻ drift layer 1 --.

Column 1, line 50, the text "reaching then drift layer 1" should be changed to -- reaching the n⁻ drift layer 1 --.

Column 2, line 18, the text "then drift layer 1" should be changed to -- the n⁻ drift layer 1 --.

Column 2, line 29, the text "then drift layer 1" should be changed to -- the n⁻ drift layer 1 --.

Column 2, line 32, the text "then drift layer 1" should be changed to -- the n⁻ drift layer 1 --.

Column 2, line 39, the text "then drift layer 1" should be changed to -- the n⁻ drift layer 1 --.

Column 2, line 46, the text "then drift layer 1" should be changed to -- the n⁻ drift layer 1 --.

Signed and Sealed this
Sixth Day of December, 2016

Michelle K. Lee
*Director of the United States Patent and Trademark Office*